US012287583B2

United States Patent
Hulsebos (10) Patent No.: US 12,287,583 B2
(45) Date of Patent: Apr. 29, 2025

(54) METHOD FOR MODELING MEASUREMENT DATA OVER A SUBSTRATE AREA AND ASSOCIATED APPARATUSES

(71) Applicant: ASML Netherlands B.V., Veldhoven (NL)

(72) Inventor: Edo Maria Hulsebos, Bergeijk (NL)

(73) Assignee: ASML Netherlands B.V., Veldhoven (NL)

( * ) Notice: Subject to any disclaimer, the term of this patent is extended or adjusted under 35 U.S.C. 154(b) by 258 days.

(21) Appl. No.: 18/001,869

(22) PCT Filed: May 18, 2021

(86) PCT No.: PCT/EP2021/063147
§ 371 (c)(1),
(2) Date: Dec. 14, 2022

(87) PCT Pub. No.: WO2021/254709
PCT Pub. Date: Dec. 23, 2021

(65) Prior Publication Data
US 2023/0221655 A1    Jul. 13, 2023

(30) Foreign Application Priority Data
Jun. 16, 2020    (EP) .................................... 20180323

(51) Int. Cl.
*G03F 7/00*    (2006.01)
*G03F 9/00*    (2006.01)

(52) U.S. Cl.
CPC .......... *G03F 7/70525* (2013.01); *G03F 7/705* (2013.01); *G03F 9/7003* (2013.01)

(58) Field of Classification Search
CPC .... G03F 7/70525; G03F 7/705; G03F 9/7003; G03F 7/70508; G03F 7/70633; G03F 7/706837; G03F 7/706839
See application file for complete search history.

(56) References Cited

U.S. PATENT DOCUMENTS 6,952,253 B2    10/2005  Lof et al.
7,583,359 B2     9/2009  Moest
(Continued)

FOREIGN PATENT DOCUMENTS

JP    2008-028389 A    2/2008
WO    WO 2010/034674 A1    4/2010
(Continued)

OTHER PUBLICATIONS

International Search Report and Written Opinion of the International Searching Authority directed to International Patent Application No. PCT/EP2021/063147, mailed Nov. 24, 2021; 16 pages.
(Continued)

*Primary Examiner* — Hung V Nguyen
(74) *Attorney, Agent, or Firm* — Sterne, Kessler, Goldstein, & Fox P.L.L.C.

(57) ABSTRACT

Disclosed is a method for modeling measurement data over a substrate area and associated apparatus. The method comprises obtaining measurement data relating to a first layout; modeling a second model based on said first layout; evaluating the second model on a second layout, the second layout being more dense than said first layout; and fitting a first model to this second model according to the second layout.

14 Claims, 2 Drawing Sheets

(56) References Cited

U.S. PATENT DOCUMENTS

| | | | |
|---|---|---|---|
| 7,916,284 B2 | 3/2011 | Dusa et al. | |
| 11,022,896 B2* | 6/2021 | Schmitt-Weaver | G03F 7/705 |
| 11,175,591 B2* | 11/2021 | Cekli | G03F 7/70633 |
| 2011/0224963 A1 | 9/2011 | Isoyan et al. | |
| 2012/0218533 A1 | 8/2012 | Lyulina et al. | |
| 2018/0356736 A1* | 12/2018 | Danilin | G03F 7/70516 |

FOREIGN PATENT DOCUMENTS

| | | |
|---|---|---|
| WO | WO 2017/060054 A1 | 4/2017 |
| WO | WO 2019/001871 A1 | 1/2019 |
| WO | WO 2020/094325 A1 | 5/2020 |
| WO | WO 2020/126242 A1 | 6/2020 |

OTHER PUBLICATIONS

International Preliminary Report on Patentability directed to International Patent Application No. PCT/EP2021/063147, issued Dec. 13, 2022; 11 pages.

Korean Request for the Submission of an Opinion directed to Korean Patent Application No. 10-2023-7001582, mailed Oct. 28, 2024; 11 pages.

* cited by examiner

METHOD FOR MODELING MEASUREMENT DATA OVER A SUBSTRATE AREA AND ASSOCIATED APPARATUSES

CROSS-REFERENCE TO RELATED APPLICATIONS

This application claims priority of EP application 20180323.6 which was filed on Jun. 16, 2020 and which is incorporated herein in its entirety by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k1\times\lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and k1 is an empirical resolution factor. In general, the smaller k1 the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA,) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low k1.

Effectiveness of the control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's submicron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

These distortions of the wafer grid are represented by measurement data associated with mark position. The measurement data are obtained from measurements of wafers. An example of such measurements are alignment measurements of alignment marks performed using an alignment system in a lithographic apparatus prior to exposure. Another example of such measurements are overlay measurements of overlay targets performed using a metrology system after exposure.

SUMMARY

In a first aspect of the invention there is provided a method for modeling measurement data over a substrate area relating to a substrate in a lithographic process, comprising obtaining measurement data relating to a first layout; modeling a second model based on said first layout; evaluating the second model on a second layout, the second layout being more dense than said first layout; and fitting a first model to this second model according to the second layout.

In a second aspect of the invention there is provided a method of determining a polynomial subspace with minimum bending energy for given model layout comprising: performing a bending energy orthonormalization of a model matrix describing a model; removing the linear part from the model matrix; calculating and truncating a single value decomposition of the model matrix; and calculating a subspace matrix corresponding to the truncated decomposed model matrix obtained by the previous step.

In a third aspect of the invention there is provided a method of regularizing a fitting of a model to measurement data from a substrate; comprising calculating a bending covariance matrix based on a description of bending energy within the substrate; and determining a Tikhonov regularization term for the fitting from said bending covariance matrix In a further aspect of the invention, there is provided a computer program comprising program instructions operable to perform the method of the first aspect when run on a suitable apparatus, and associated processing apparatus and lithographic apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
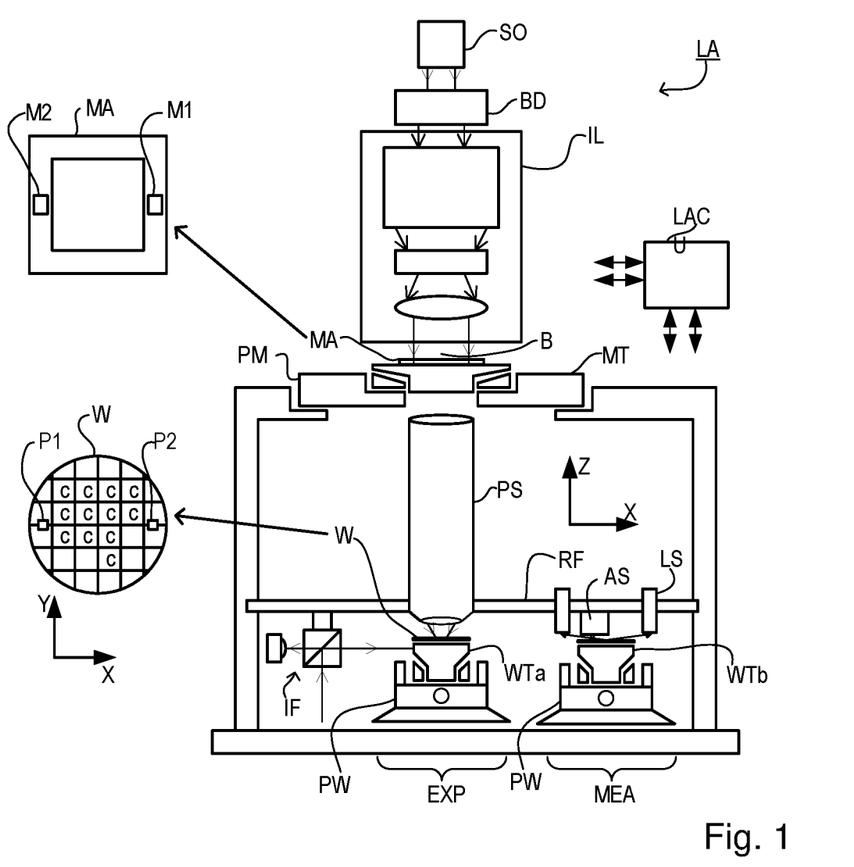
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

Lithographic apparatus LA in this example is of a so-called dual stage type which has two substrate tables WTa and WTb and two stations—an exposure station and a measurement station-between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks may deviate from the ideal grid. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
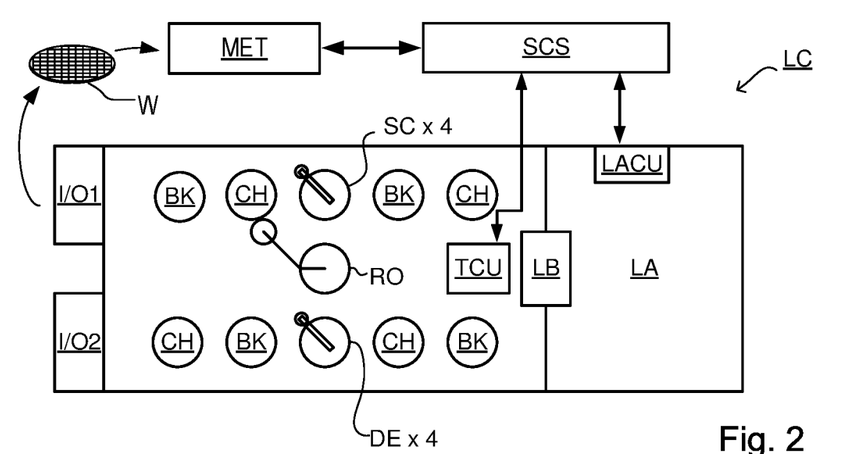
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
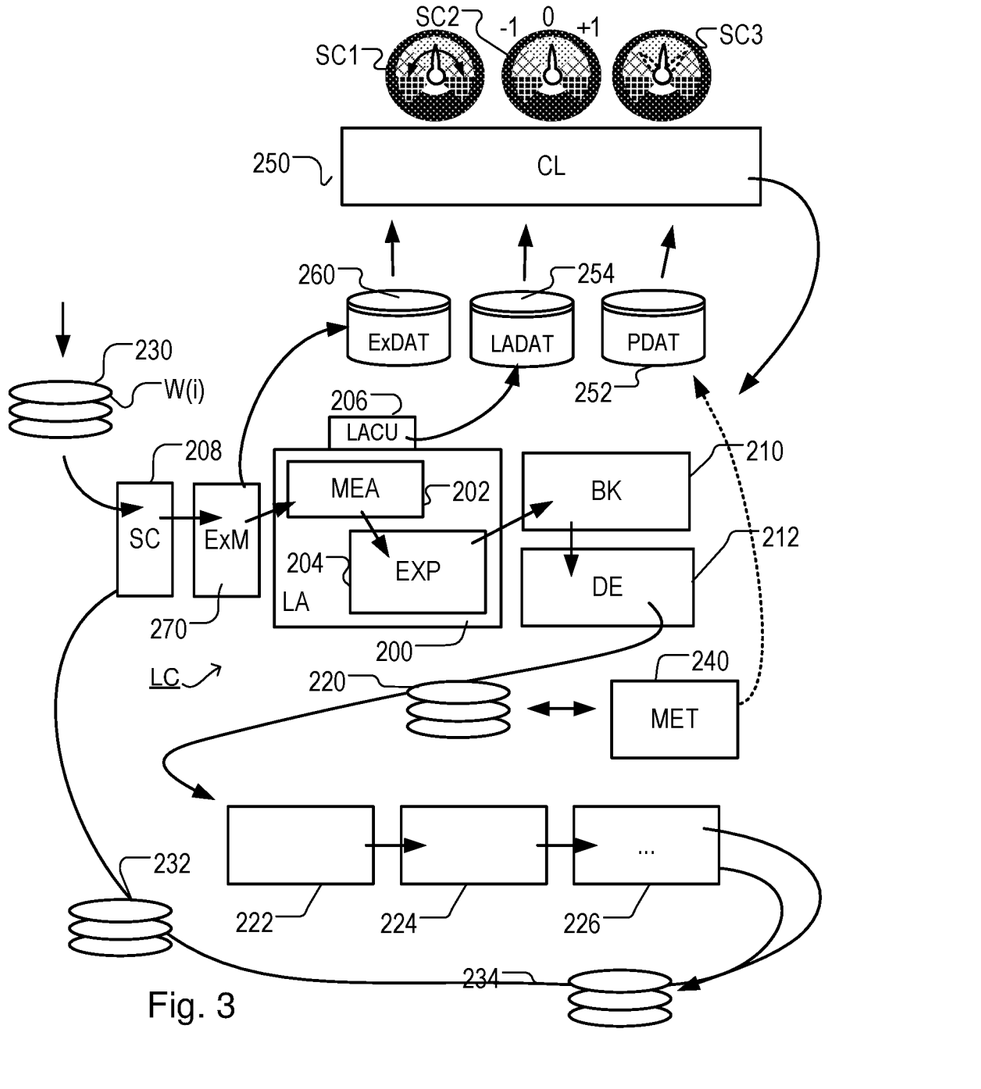
FIG. 3 shows schematically the use of the lithographic apparatus and lithographic cell of FIGS. 1 and 2 together with one or more other apparatuses forming a manufacturing facility for, e.g., semiconductor devices, the facility implementing a control strategy according to an embodiment of the invention.

FIG. 3 shows the lithographic apparatus LA and the lithocell LC in the context of an industrial manufacturing facility for, e.g., semiconductor products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

The manufacture of semiconductor devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a 'dry' tool. One or more layers may be exposed in a tool working at DUV wavelengths, while one or more others are exposed using EUV wavelength radiation.

Also shown in FIG. 3 is the metrology apparatus (MET) 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, performance parameter data PDAT 252 may be determined. From this performance parameter data PDAT 252, it may be further determined that a performance parameter, such as overlay or critical dimension (CD), does not meet specified accuracy requirements in the developed resist. Prior to the etching step, the opportunity exists to strip the developed resist and reprocess one or more of the substrates 220 through the litho cluster. Moreover, the metrology results from the metrology apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third dial SC3).

Computer system 250 can implement control of the process based on a combination of (i) "pre-processing metrology data" (e.g., including scanner metrology data LADAT 254, and External pre-processing metrology ExDAT 260), associated with substrates before they are processed in a given processing step (for example a lithography step) and (ii) performance data or "post-processing data" PDAT 252 that is associated with the substrates after they have been processed.

A first set of pre-processing metrology data LADAT 254 (referred to herein as scanner metrology data, as it is data generated by the lithographic apparatus LA 200 or scanner) may comprise the alignment data conventionally obtained by the lithographic apparatus LA 200 using alignment sensor AS in the measurement station 202. Alternatively, or in addition to the alignment data, the scanner metrology data LADAT 254 may include height data obtained using level sensor LS, and/or "wafer quality" signals from the alignment sensor AS or the like. As such, the scanner metrology data LADAT 254 may comprise an alignment grid for the substrate, and data relating to substrate deformation (flatness). For example, the scanner metrology data LADAT 254 may be generated by the measurement station MEA 202 of twin stage lithographic apparatus LA 200 (e.g., as this typically comprises the alignment sensor and leveling sensor) in advance of exposure, enabling simultaneous measurement and exposure operations. Such twin stage lithographic apparatus are well known.

Increasingly, (e.g. stand-alone) external pre-exposure metrology tools ExM 270 are used to make measurements before exposure on a lithographic apparatus. Such external pre-exposure metrology tools ExM 270 are distinct from the measurement station MEA 202 of a twin stage lithographic apparatus LA 200. Any pre-exposure measurements performed within the track are also considered to be external measurements. To maintain exposure throughput at a sufficient level, the scanner metrology data LADAT (e.g., alignment grid and substrate deformation grid) measured by measurement station MEA 202 is based on a sparser set of measurements as would be desirable. This typically means such a measurement station is incapable of gathering sufficient measurement data for higher order corrections, and particularly corrections beyond the third order. In addition to this, use of an opaque hard mask can make it difficult to accurately measure the wafer grid in alignment.

External pre-exposure metrology tools ExM 270 enable much denser measurements to be made on each substrate, prior to exposure. Some of these pre-exposure metrology tools ExM 270 measure and/or predict wafer grid deformation at a throughput equal to or faster than the scanner, and with a measurement density much higher than can be achieved using an alignment sensor and level sensor, even when such sensors are comprised within a separate measurement station MEA 202. Pre-exposure metrology tools comprise, for example, substrate shape inspection tools and/or stand-alone alignment stations.

While FIG. 3 shows separate storage 252, 254, 260 for each of the performance data PDAT, scanner metrology data LADAT and external pre-exposure data ExDAT, it will be appreciated that these different types of data may be stored in one common storage unit, or may be distributed over a larger number of storage units, from which particular items of data can be retrieved when required.

To represent alignment measurements over a wafer and/or over a field, an alignment model is used. A first purpose of an alignment model is to provide a mechanism for interpolating and/or extrapolating the available measurements data over the whole wafer, such that an expose grid can be created on each die. The measurement data will be sparse as it is simply not practical to measure as many measurement regions as would be desirable from a modeling perspective: the time and therefore throughput overhead would be too high. A second purpose of an alignment model is to provide noise suppression. This may be achieved by using fewer model parameters than measurements.

While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on third and higher order polynomial functions. RBF modeling is described in US2012218533A1, which is incorporated herein by reference. Different versions and extensions of these advanced models can be devised. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

At present, polynomial based models, such as HOWA, are predominately used for both the interfield and intrafield wafer deformation modeling. However, because there is a strong non-uniform distribution of the polynomials over the wafer, which becomes worse for higher order polynomials, the fitting of polynomial models to a sparse set of alignment measurements results in strong modeling artifacts near the edge of the wafer (or edge of the field in case of intrafield wafer alignment IFWA).

RBF modeling can address some of these modeling artifact issues. RBF modeling essentially comprises an interpolation method, e.g., based on radial-based thin plate splines. However, as the RBF model consists of an interpolation scheme, it has no noise suppression. Furthermore, an RBF model is not a real model in the sense that the model functions depend on the specific wafer alignment mark layout. In addition to this, there is a resistance to fundamental change in the industry, such as going from the more familiar polynomial based modeling to RBF modeling.

US2012218533A1 describes a RBF modeling method which comprises the steps of using measured locations of the marks to generate radial basis functions, and calculating model parameters of said substrate within said apparatus using the generated radial basis functions as a basis function across said substrate. RBFs $\phi(\vec{x}, \vec{c})$ are real-valued functions whose value depend only on the distance from the origin, or alternatively on the distance x from some other point, called center c, so that:

$$\phi(\vec{x}, \vec{c}) = \phi(\|\vec{x} - \vec{c}\|) = \phi(r)$$

Function approximation with RBFs may be built in the form:

$$y(\tilde{x}) = \sum_{i=1}^{N} w_i \phi(\|\vec{x} - \vec{c}\|)$$

where the approximating function $y(\tilde{x})$ is be represented as a sum of N radial basis functions (RBFs), each associated with a different center c and weighted by an appropriate coefficient $w_i$ and $\|\cdot\|$ is the notation for a standard Euclidean vector norm. The weights $w_i$ may be computed using the least square method in such a way that the interpolation conditions are met: $Y(x_i) = y_i$. The linear system for the weight coefficients may look like:

$$\begin{bmatrix} \phi_{11} & \phi_{12} & \phi_{1N} \\ \vdots & \vdots & \vdots \\ \phi_{N1} & \phi_{N2} & \phi_{NN} \end{bmatrix} \begin{bmatrix} w_1 \\ \vdots \\ w_N \end{bmatrix} = \begin{bmatrix} y_1 \\ \vdots \\ y_N \end{bmatrix}$$

where $\phi_{ij} = \phi(r_{ij})$ and $r_{ij}$ is the distance between two points (e.g. the distance between two marks). It may be noted that there are as many weight coefficients, i.e. degrees of freedom, as there are interpolation conditions. The resulting system of equations is non-singular (invertible) under very mild conditions and therefore a unique solution exists. For many of the radial basis functions (RBFs) the only restriction is that at least 3 points are not on a straight line.

Numerous choices for RBFs are possible, such as Gaussian basis functions, inverse basis functions, multi-quadratic basis functions, inverse quadratic basis functions, spline degree k basis functions and thin plate spline basis functions. It is noted that also other RBFs are possible. Two major RBF classes are given below: infinitely smooth (whose derivatives exist at each point) and splines (whose derivatives may not exist in some points). Thin plate spline (TPS) refers to a physical analogy involving the bending of a thin sheet of metal. In the physical setting, the deflection is in the z direction, orthogonal to the plane of the thin sheet. In order to apply this idea to the problem of substrate deformation in a lithographic process, the lifting of the plate can be interpreted as a displacement of the x or y coordinates within the plane. TPS has been widely used as a non-rigid transformation model in image alignment and shape matching.

It is therefore proposed to retain a polynomial based (first) model, but use a second model in order to overcome the aforementioned problems near the edge of the wafer/field of the polynomial model. As such, the second model should be one that does not suffer the same edge performance issue. In this way, the edge performance can be improved while retaining the polynomial model as a basis.

A suitable model for the second model may be the RBF model, as it shows good interpolation and extrapolation (and therefore wafer edge) properties regardless of the measurement layout. Therefore, such an approach utilizes the RBF model for what it does best: interpolation and extrapolation. By using the dense grid, the problems with the polynomials near the wafer edge disappear.

Figure 4:
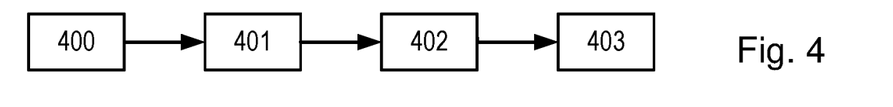
FIG. 4 is a flowchart describing a method according to an embodiment of the invention.

FIG. 4 is a flowchart describing the basic steps of such a method in a conceptual implementation, which comprise:
  400. Modeling the second model (e.g., a RBF model) using a first layout (e.g., a standard layout or similar such as a fine wafer alignment layout based on a relatively sparse measurement scheme);
  401. Evaluating the second model on a second layout (e.g., a denser or very dense layout comprising 10× or 100× or 1000× more locations than the standard layout); such a layout may uniformly cover the entire wafer. In this manner the second model performs the interpolation/extrapolation;
  402. Fitting the desired first model (polynomial model) to this second model on the very dense second layout using the desired model order (for example $3^{rd}$ order or higher). As such the first model is modeled on the dense layout with the first model reducing the model order;
  403. Using the fitted first model for alignment; e.g., to determine wafer grid for exposure and control therefor.

This conceptual implementation, and specifically the evaluation of the RBF model on a very dense layout and the fitting of the polynomial model to the very dense layout, is costly in terms of calculation footprint. Therefore, a more practical implementation may comprise an oblique polynomial fitting based on RBF interpolation. More specifically, such an implementation may comprise translating the process into an oblique subspace model or generalized least squares fit model in combination with performing wafer alignment model mapping (WAMM) on the sparse measurement layout. All these concepts will be described below in more detail, It can be demonstrated that such a method may be exactly equivalent to the conceptual method of FIG. 4. In this manner, the very dense layout is used only for the calibration of the modeling techniques. This can be done offline as it does not require any measurement data; only the (sparse) measurement layout and the model types used are required as an input for this calibration and no training is necessary. To implement this, oblique fitting techniques, subspace modeling and WAMM are performed. Another equivalent subspace modeling method, comprising determining the subspace to have minimum bending energy, will also be described.

Wafer Alignment Model Mapping and Subspace Mapping

In wafer alignment model mapping (WAMM) the model parameters are modified by applying a linear transformation on them. This linear transformation can be considered as a matrix multiplication: the model parameters are arranged together into a column vector, which is multiplied with a matrix to obtain a new column vector of model parameters. The matrix involved is referred to as the model mapping matrix. The main purpose for this model mapping matrix is to act as a linear filter: it aims to improve the (e.g., overlay) performance of wafer alignment by filtering out components (shapes) which deteriorate overlay and modifying the remaining shapes to further improve overlay. The concept of wafer alignment model mapping is described in WO2017060054 (which is incorporated herein by reference) and will now be briefly described.

In a known correction strategy known as advanced process correction (APC), the APC control loop calculates/optimizes APC expose corrections in a feedback loop; i.e., based on past alignment and overlay data, so to attempt to approximate the "true wafer deformation" Y as closely as possible according to the sum of by wafer deformation as measured (i.e., matrix X comprising wafer alignment model parameters obtained from alignment sensor measurements on multiple wafers) and the APC expose corrections $C_{apc}$:

$$Y \approx X + C_{apc}$$

WAMM comprises replacing the approximation method for such an APC correction design from by:

$$Y \approx X M_{wamm} + C_{apc}$$

where Matrix $M_{wamm}$ is the model mapping matrix, defining a mapping from the wafer alignment model parameter space X to the overlay model parameter space Y. By performing the model mapping, the overlay can be improved compared to the earlier APC approximation. Calibration calculations in the control loops can be modified to calculate not only the process corrections $C_{apc}$, but also the model mapping matrix $M_{wamm}$. If it is desired to use nonlinear mapping, then a more generalized mapping function, rather than a mapping matrix, can be used. Calculation of the model mapping, based on historical data, can be done by any suitable training method. An approach similar to a Wiener filter can be applied, for example.

The dimensionality of the mapped substrate model can also be reduced, for example by application of known statistical techniques. By applying a Singular Value Decomposition to matrix M, for example, the equation above can be written as:

$$Y \approx XUSV' + C_{apc}$$

where U and V are orthogonal coordinate transformation matrices and S is a diagonal matrix containing the singular values of matrix $M_{wamm}$. The expressions XU and YV can in this case be considered as subspaces of the parameter space of X and Y respectively. Each subspace has dimensions defined by a base vector in terms of the parameters of the parameter space. Each single base vector from XU is mapped onto a single base vector YV with the corresponding singular value from S as a scaling factor. By deleting selected singular values (setting them to zero), one can limit the mapping to a linear subspace of the original model parameter spaces. Deleting singular values is equivalent to removing columns of the matrices U and V. Note that values in S, XU and YV can be used to select which "subspace" parameters to reject and which to maintain. For example, S provides the scaling of the parameter. If the scaling factor is very low (close to 0) this means that the subspace base vector is irrelevant for overlay, and may be discarded. Discarding these terms helps to reduce processing, and leaves the significant contributions more visible, if one wants to gain insight into the causes of overlay error. If S provides an (extremely) large singular value (scaling factor) in combination with a very weak model parameter in XU, it may be desirable to delete such a base vector. Such a contribution is not robust or reliable, and could introduce relatively large errors in the presence of random variations in the input measurements. By reducing the number of dimensions of the model space, the noise suppression (scheme factor) improves.

Generalized and Oblique Projection Least Squares Wafer Alignment Fitting

Now the concept of an oblique projection model will be described. When going from a dense to a sparse alignment grid, the orthogonality relations between the correctable and non-correctable components change: on the dense layout the correctable and non-correctable components are orthogonal, while on the sparse layout they are not. This non-orthogonality associated with the sparse layout leads to crosstalk. According to the present disclosure, the crosstalk can be reduced via an oblique fitting technique comprising modifying an inner product element associated with the sparse layout such that the orthogonality between correctable and non-correctable components is similar to the dense layout, or an oblique projection least squares fit comprising basing the inner product of the sparse layout on a different (non-orthogonal) basis.

According to the present disclosure, the generalized least squares fit is discussed as follows. An inner product can be computed using $\langle x, y \rangle = x^T y$, where x and y are column vectors containing the measurement data, i.e., alignment measurement data or overlay measurement data, at different mark locations on the wafer. Then, a norm associated with this inner product can be calculated as $\|x\| = \sqrt{\langle x, x \rangle} = \sqrt{x^T x}$.

Now, assume that y comprises densely measured alignment data (or uncorrected overlay data) associated with the dense layout, i.e., the first measurement data. Then, the correctable component ($y_{correctable}$) of the dense layout data can be computed using: $y_{correctable} = M_y c_y$, where $M_y$ contains model functions sampled at the dense mark locations and $c_y$ comprises the fit coefficients of the model to the dense layout data.

In case of ordinary least square the fit coefficients are optimized using the least squares norm described above. It can be shown that the result of this optimization can be computed using $c_y = M_y^+ y = (M_y^T M_y)^{-1} M_y^T y$, where the '+' operator stands for the pseudo inverse of a matrix.

By combining the previous two equations of $y_{correctable}$ and $c_y$, $$y_{correctable} = M_y c_y = M_y M_y^+ y = M_y (M_y^T M_y)^{-1} M_y^T y = P_y y$$

where $P_y$ is an orthogonal projection matrix that projects the measured data y on the space spanned by the columns of model matrix $M_y$, which results in the correctable component $y_{correctable}$. Thus conceptually, conventional wafer alignment using a least squares fit can be considered as an orthogonal projection of the measured data on the space spanned by the model, using the inner product. The oblique inner product between two column vectors x and y may be computed as $\langle x, y \rangle_w = x^T W_T W y$. And, the oblique norm as $\|x\|_w = \sqrt{\langle x, x \rangle_w} = \sqrt{x^T W^T W x}$, where the matrix W can be considered base transformation matrix (i.e., the oblique inner product matrix). The inner product and norm are the new inner product and norm defined on the new oblique base, according to the present disclosure. Consider that x contains sparse wafer alignment measurement data (e.g., the measured data) and y describes dense wafer alignment data. It can be shown that the fit coefficients from the generalized least squares fit, using the oblique norm can be written as:

$$c_w = (M_x^T W^T W M_x)^{-1} M_x^T W^T W x = (W M_x)^+ W x$$

where $M_x$ is the model matrix for the sparse measurement data. These fit coefficients $c_w$ may be used to approximate the dense layout alignment data, and optimize the oblique inner product matrix W.

An approximation of the wafer alignment model associated with the sparse layout is performed in cooperation with the model associated with the dense layout. Such wafer alignment model can be computed by executing following equations:

$$\begin{aligned} x_{correction} &= M_y c_w \\ &= M_y (M_x^T W^T W M_x)^{-1} M_x^T W^T W x \\ &= M_y (W M_x)^+ W x \end{aligned}$$

In an embodiment, the coefficients in matrix W are optimized such that the wafer alignment model associated with the sparse layout closely approximates results of the dense layout data (or uncorrected overlay data). The coefficients of W are determined by executing the following equation:

$$\begin{aligned} w &= \underset{w}{\operatorname{argmin}} \|y_{correctable} - x_{correction}(W)\| \\ &= \underset{w}{\operatorname{argmin}} \|M_y M_y^+ y - M_y (W M_x)^+ W x\| \end{aligned}$$

The oblique projection least squares fitting briefly discussed below. In the oblique projection least squares fitting, the following equation is executed.

$$\begin{aligned} c_P &= (M_x^T M_x)^{-1} M_x^T P x \\ &= M_x^+ P x \end{aligned}$$

Where, P is an oblique projection matrix. As the non-correctable component on the dense alignment layout is not orthogonal to the correctable component on the sparse alignment layout, it can be blocked using an oblique projection matrix as long as the correctable and non-correctable are at least linearly independent on the sparse grid.

In an embodiment, matrix P (i.e., oblique projection matrix) is optimized such that the sparse wafer alignment model result matches as closely as possible with the dense alignment data (or dense de-corrected overlay data). For example, determining values of the coefficients in matrix P, under the constraint of it being an oblique projection matrix (e.g., a matrix diagnosable with each eigenvalues either equal to 0 or 1). In an embodiment, the optimization is performed iteratively executing the following model, such that the values of coefficients of P progressively reduces (e.g., in an embodiment minimizes) the aforementioned difference.

$$P = \underset{P \text{ being a oblique projection matrix}}{\operatorname{argmin}} \|y_{correctable} - M_y c_P\|$$

$$= \underset{P \text{ being a oblique projection matrix}}{\operatorname{argmin}} \|M_y(M_y^+ y - M_x^+ Px)\|$$

Equivalence of WAMM and Oblique Projection/Generalized LS Fitting to Steps 401-403

The process described in steps 401 to 403 comprises a linear operation as each of the steps is linear. This means that these three steps together can be described by a single matrix F which maps from the measurements to the polynomial model parameters. Any matrix, and therefore matrix F, can be decomposed into oblique subspace modeling (or a generalized least squares fit) in combination with WAMM. As such, the conceptual method embodied by steps 401 to 403 can be translated into performing the following steps on the sparse layout: oblique fitting, subspace modeling and WAMM.

This is described by the following steps and equations:
1) Polynomial modeling, after RBF interpolation on sparse layout:

$$F = M_{1,d}^+ dM_{2,d} M_{2,s}^+$$

2) Oblique subspace modeling with WAMM:

$$F = M_{wamm} M_{1,s}^+ P$$

$$F = M_{wamm} M_{subspace} (WM_{1,s} M_{subspace})^+ W$$

3) Translate modeling into oblique subspace with WAMM:

$$M_{subspace} = \operatorname{range}(F)$$

$$P = M_{1,s} M_{subspace} (FM_{1,s} M_{subspace})^+ F$$

$$W = (M_{1,s} M_{subspace})^+ P = (FM_{1,s} M_{subspace})^+ F$$

$$M_{wamm} = FM_{1,s}$$

In these equations, $M_{1,s}$, $M_{1,d}$ is the model matrix for the first (polynomial) model on the sparse layout and dense layout respectively, $M_{2,s}$, $M_{2,d}$ is the model matrix for the second (RBF) model on the sparse layout and dense layout respectively, P is the oblique projection matrix, W is the matrix which defines the inner product for the generalized least squares fit, $M_{wamm}$ is the model mapping matrix and $M_{subspace}$ is the subspace matrix. The '+' operator stands for the pseudo inverse of a matrix. The columns of $M_{subspace}$ are chosen such that the form a basis of the range of F.

Using such methods, the modeling the oblique polynomial model results show a clear improvement at the edge of the wafer compared to the regular polynomial (e.g., HOWA). Additionally there is no longer a risk of overfitting: a 7th order polynomial model or higher may be used without a problem, while the number of measurements in a typical measurement scheme is insufficient for fitting a 7th order polynomial in the conventional least squares manner. As such, the first model may be a third order, fourth order, fifth order, sixth order, seventh order or higher than seventh order model.

Model Subspace Selection and Tikhonov Regularization Using Bending Energy

It is proposed that the bending energy inner product may be used to improve the polynomial fitting (although the concepts are not limited to polynomial models; they can be used for any model for which the bending energy (or related parameter) can be calculated), either in the abovementioned methods or generally for any polynomial or other alignment model. Such a method may comprise create a polynomial subspace with minimum bending energy for given layout using Singular Value Decomposition and/or Performing Tikhonov regularization using bending energy. Such a method may, for example, be used in determining the subspace matrix $M_{subspace}$ above. However, note that bending energy minimal subspace embodiments require only subspace modeling; no oblique fit and no WAMM is required.

Bending Energy Principle

Both concepts rely on the use of the bending energy inner product $\langle u, v \rangle$:

$$\langle u | v \rangle_b = \int_{wafer} \frac{\partial^2 u}{\partial x^2} \frac{\partial^2 v}{\partial x^2} + 2 \frac{\partial^2 u}{\partial x \partial y} \frac{\partial^2 v}{\partial x \partial y} + \frac{\partial^2 u}{\partial y^2} \frac{\partial^2 v}{\partial y^2} dx dy$$

Note that the bending energy is zero for DC and linear slopes, so the inner product is only defined on the orthogonal complement of DC and slopes (3 parameters). As an alternative to bending energy, the techniques described here may be based on in-plane deformation energy or similar parameter.

Noting that the bending energy $E_b(u)$ is:

$$E_b(u) = \int_{wafer} \left(\frac{\partial^2 u}{\partial x^2}\right)^2 + 2\left(\frac{\partial^2 u}{\partial x \partial y}\right)^2 + \left(\frac{\partial^2 u}{\partial y^2}\right)^2 dx dy$$

then the bending energy in terms of inner product is:

$$E_b(u) = \|u\|_b^2 = \langle u | u \rangle_b$$

If the fitted model u(x, y) is:

$$u(x, y) = \sum_i c_j \cdot p_i(x, y)$$

Then the bending energy of fitted model in terms of model parameters p is:

$$E_b(u) = \langle u | u \rangle_b = \left\langle \sum_i c_j \cdot p_j \middle| \sum_j c_j \cdot p_j \right\rangle_b$$

$$= \sum_i \sum_j c_j \cdot c_j \langle p_i | p_j \rangle_b = c^T M_{cov} c$$

and the bending covariance matrix $[M_{cov}]_{ij}$ of the model functions is:

$$[M_{cov}]_{ij} = \langle p_i | p_j \rangle_b = \int_{wafer} \frac{\partial^2 p_i}{\partial x^2} \frac{\partial^2 p_j}{\partial x^2} + 2 \frac{\partial^2 p_i}{\partial x \partial y} \frac{\partial^2 p_j}{\partial x \partial y} + \frac{\partial^2 p_i}{\partial y^2} \frac{\partial^2 p_j}{\partial y^2} dx dy$$

Tikhonov Regularization Using Bending Energy

For the model matrix M, the fit functions are evaluated on the sparse layout:

$$[M]_{ij} = p_j(x_i, y_i)$$

Performing an ordinary least squares fit yields the coefficients $c_{lsq}$:

$$c_{lsq} = \underset{c}{\mathrm{argmin}}\{\|dx - Mc\|^2\}$$

Adapting this to include Tikhonov regularization based on bending energy yields the coefficients $c_{tikhonov}$:

$$c_{tikhonov} = \underset{c}{\mathrm{argmin}}\{\|dx - Mc\|^2 + \lambda \cdot c^T M_{cov} c\}$$

The solution for this is:

$$c_{tikhonov} = (M^T M + \lambda M_{cov})^{-1} M^T dx$$

Model Subspace Selection by SVD Truncation

Figure 5:
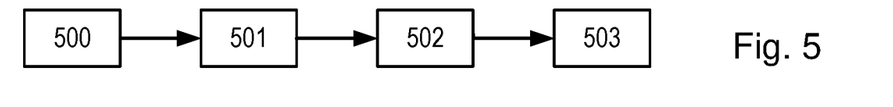
FIG. 5 is a flowchart describing a method for selecting a model subspace according to an embodiment of the invention.

FIG. 5 comprises the steps of a method for selecting a model subspace (e.g., determining the subspace matrix $M_{subspace}$ described above) according to an embodiment. Such a method is an alternative to any of the other subspace mapping methods described in, for example, WO2017060054 and summarized above.

At step 500, a bending energy orthonormalization of the (e.g., first/polynomial) model matrix is performed on an infinitely dense (continuous) layout (as the covariance matrix is based on integration over the wafer). This may comprise a Cholesky factorization of bending covariance matrix $M_{cov}$ (linear part excluded due to there being no bending energy):

$$M_{cov} = R^T R$$

The bending energy orthonormalization of the model matrix may then comprise (based on a Tikhonov regularized implementation):

$$\begin{aligned}c_{tikhonov} &= \arg\min_{c}\{\|dx - Mc\|^2 + \lambda \cdot c^T M_{cov} c\} \\ &= \arg\min_{c}\{\|dx - MR^{-1} Rc\|^2 + \lambda \cdot c^T R^T R c\} \\ &= \arg\min_{c}\{\|dx - \tilde{M}\tilde{c}\|^2 + \lambda \cdot \tilde{c}^T I \tilde{c}\}\end{aligned}$$

At step 501, the linear part (e.g., the typically 6 linear parameters) is removed from the model matrix; where the linear model may be:

$$[L]_{i1} = 1, [L]_{i2} = x_i, [L]_{i3} = y_i,$$

At step 502, a singular value decomposition (SVD) of the model matrix on the sparse layout is calculated and truncated. This comprises performing SVD on the orthonormal bending model matrix:

$$\tilde{M} = USV^T$$

which yields the following solution using Tikhonov regularization:

$$\begin{aligned}\tilde{c}_{tikhonov} &= \left(\tilde{M}^T \tilde{M} + \lambda I\right)^{-1} \tilde{M}^T dx \\ &= (VSU^T USV^T + \lambda I)^{-1} VSU^T dx \\ &= V(S^2 + \lambda I)^{-1} SU^T dx \\ &= VDU^T dx\end{aligned}$$

$$[D]_{ii} = \frac{s_i}{s_i^2 + \lambda}$$

Other treatments are of course possible; for example without regularization this step may yield:

$$[D]_{ii} = \frac{1}{s_i}$$

and with subspace equaling SVD truncation:

$$[D]_{ii} = \begin{cases} \frac{1}{s_i} & \text{for } i \leq N_{par} \\ 0 & \text{for } i > N_{par} \end{cases}$$

another regularization strategy based on the publication "A new Tikhonov regularization method" by Martin Fuhry and Lothar Reichel, may yield:

$$[D]_{ii} = \begin{cases} \frac{1}{s_i} & \text{for } s_i^2 \leq \lambda \\ \frac{s_i}{\lambda} & \text{for } s_i^2 < \lambda \end{cases}$$

At step 503 the corresponding subspace matrix is calculated. Subspace modeling yields:

$$\begin{aligned}c_{subspace} &= M_{subspace}(M M_{subspace})^{+} dx \\ &= M_{subspace}\left(M_{subspace}^T M^T M M_{subspace}\right)^{-1} M_{subspace}^T M^T dx\end{aligned}$$

Model matrix $M_{ortho}$ with orthonormal bending energy and orthogonal SVD sorted first model energy can be determined as:

$$M_{ortho} = \tilde{M} V = M R^{-1} V$$

The minimum bending energy subspace equals the truncated orthonormal model matrix, therefore:

$$M_{subspace} = R^{-1} V_{trunc} = R^{-1} V(:,1:N_{par})$$

The calculation of the bending covariance matrix for a polynomial model has been described. For an RBF model K; e.g.:

$$[K]_{ij} = r_{ij}^2 \cdot \log(r_{ij}), r_{ij} = \sqrt{(x_i - x_j)^2 + (y_i - y_j)^2}$$

the RBF problem with a finite bending energy constraint becomes:

$$c = \underset{c}{\mathrm{argmin}}\|Kw + Pa - x\|^2 + \lambda w^T K w$$

$$Pw = 0$$

and the bending energy is:

$$E_b = w^T K w, \quad M_{cov} = \begin{pmatrix} 0 & 0 \\ 0 & K \end{pmatrix}$$

Note that the bending energy for an RBF model is over the full space, extending to infinity, while for the polynomial model the bending energy is considered only within the wafer radius. The reason for this is that expressions for RBF bending energy within the wafer radius have not been derived and are expected to be very complicated.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor wafers, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Other aspects of the invention are set out in the following numbered clauses.

1. A method for modeling measurement data over a substrate area relating to a substrate in a lithographic process, comprising
   a) obtaining measurement data relating to a first layout;
   b) modeling a second model based on said first layout;
   c) evaluating the second model on a second layout, the second layout being more dense than said first layout; and
   d) fitting a first model to this second model according to the second layout.
2. A method as claimed in clause 1, wherein the first layout corresponds to mark locations from which the measurement data was measured.
3. A method as claimed in clause 1 or 2, wherein the second layout uniformly covers the entire wafer.
4. A method as claimed in any preceding clause, wherein the second layout relates to 10 times or more locations than said second layout.
5. A method as claimed in any preceding clause, wherein the first model is a polynomial model.
6. A method as claimed in any preceding clause, wherein the first model is a higher order polynomial model.
7. A method as claimed in any preceding clause, wherein the second model comprises a model having better interpolation and/or extrapolation properties than said first model.
8. A method as claimed in any preceding clause, wherein the second model is a radial base function model.
9. A method as claimed in any preceding clause, comprising performing an equivalent process to steps b), c) and d) in place of these steps to fit the first model to the first layout, the equivalent process being based on a subspace modeling or generalized least squares modeling.
10. A method as claimed in any 9, comprising:
    modeling an oblique subspace model or generalized least squares model on said first layout; and performing a model mapping operation to an oblique subspace model or generalized least squares model.
11. A method as claimed in clause 10, wherein the oblique subspace model is determined from performing an oblique fitting to a subspace matrix.
12. A method as claimed in any of clauses 9 to 11, wherein the method further comprises applying a model mapping matrix on the first layout.
13. A method as claimed in clause 12, wherein the model mapping matrix represents a correlation between the first model and the second model.
14. A method as claimed in clause 9, wherein the subspace modeling comprises determining a determining a bending energy minimum subspace by determining a subspace with minimum bending energy for the first layout.
15. A method as claimed in clause 14, comprising determining a bending energy minimum subspace matrix by performing the following steps:
    performing a bending energy orthonormalization of the first model matrix;

removing the linear part from the first model matrix;
calculating and truncating a single value decomposition of the first model matrix; and
calculating a subspace matrix corresponding to the truncated decomposed model matrix obtained by the previous step.

16. A method as claimed in clause 15, wherein performing a bending energy orthonormalization comprises:
determining a bending covariance matrix of the model functions of the first model matrix based on a description of bending energy within the substrate; and
factorizing said bending covariance matrix.

17. A method as claimed in any preceding clause, wherein said fitting step is regularized by a Tikhonov regularization using bending energy.

18. A method as claimed in clause 17, wherein the Tikhonov regularization is based on a bending covariance matrix based on a description of bending energy within the substrate.

19. A method as claimed in any preceding clause, wherein the second layout is used only for a calibration of the first model to the second model.

20. A method as claimed in clause 19, wherein the calibration is performed offline based only on the first layout and descriptions of the first model and second model.

21. A method as claimed in any preceding clause, comprising using said first model to determine a wafer grid for exposure and control of the lithographic process.

22. A method of determining a polynomial subspace with minimum bending energy for given model layout comprising:
performing a bending energy orthonormalization of a model matrix describing a model;
removing the linear part from the model matrix;
calculating and truncating a single value decomposition of the model matrix; and
calculating a subspace matrix corresponding to the truncated decomposed model matrix obtained by the previous step.

23. A method as claimed in clause 22, wherein performing a bending energy orthonormalization comprises:
determining a bending covariance matrix of the model functions of the first model matrix; and
factorizing said bending covariance matrix.

24. A method of regularizing a fitting of a model to measurement data from a substrate; comprising
calculating a bending covariance matrix based on a description of bending energy within the substrate; and
determining a Tikhonov regularization term for the fitting from said bending covariance matrix.

25. A computer program comprising program instructions operable to perform the method of any of clauses 1 to 24, when run on a suitable apparatus.

26. A non-transient computer program carrier comprising the computer program of clause 25.

27. A processing arrangement comprising:
the non-transient computer program carrier of clause 26; and
a processor operable to run the computer program comprised on said non-transient computer program carrier.

28. A lithographic apparatus comprising:
an alignment sensor;
a patterning device support for supporting a patterning device;
a substrate support for supporting a substrate; and
the processing arrangement of clause 27.

29. A lithographic apparatus as claimed in clause 28, wherein the alignment sensor is operable to measure the substrate to obtain said measurement data.

30. A lithographic apparatus as claimed in clause 28 or 29, wherein the processing arrangement is further operable to determine corrections for control said patterning device and/or substrate support based on said first model.

The invention claimed is:

1. A method for modeling measurement data over a substrate area relating to a substrate in a lithographic process, comprising:
obtaining measurement data relating to a first layout;
fitting a first model to the first layout, wherein the first model comprises an oblique subspace model or a generalized least squares model; and
performing a model mapping operation on the first model.

2. The method of claim 1, wherein the first layout corresponds to mark locations from which the measurement data was measured.

3. The method of claim 1, wherein the oblique subspace model is determined by performing an oblique fitting on a subspace matrix.

4. The method of claim 1, wherein the modeling of the oblique subspace model comprises determining a bending energy minimum subspace by determining a subspace with minimum bending energy for the first layout.

5. The method of claim 4, further comprising:
determining a bending energy minimum subspace matrix by performing operations comprising:
performing a bending energy orthonormalization of a first model matrix;
removing a linear part from the first model matrix;
calculating and truncating a single value decomposition of the first model matrix; and
calculating a subspace matrix corresponding to the truncated decomposed model matrix obtained by the previous step.

6. The method of claim 5, wherein the performing the bending energy orthonormalization comprises:
determining a bending covariance matrix of model functions of the first model matrix based on a description of bending energy within the substrate; and
factorizing the bending covariance matrix.

7. The method of claim 1, wherein the fitting is regularized by a Tikhonov regularization using bending energy.

8. The method of claim 7, wherein the Tikhonov regularization is based on a bending covariance matrix based on a description of bending energy within the substrate.

9. The method of claim 1, further comprising using the first model to determine a wafer grid for exposure and control of the lithographic process.

10. A non-transitory computer program carrier comprising a computer program comprising program instructions operable to perform a method for modeling measurement data over a substrate area relating to a substrate in a lithographic process, the program instructions configured to perform operations comprising:
obtaining measurement data relating to a first layout;
fitting a first model to the first layout, wherein the first model comprises an oblique subspace model or a generalized least squares model; and
performing a model mapping operation on the first model.

11. A processing arrangement comprising:
a non-transitory computer program carrier comprising a computer program comprising program instructions operable to perform a method for modeling measurement data over a substrate area relating to a substrate in a lithographic process, the program instructions configured to perform operations comprising:
obtaining measurement data relating to a first layout;
fitting a first model to the first layout, wherein the first model comprises an oblique subspace model or a generalized least squares model; and
performing a model mapping operation on the first model; and
a processor operable to run the computer program comprised on said non-transitory computer program carrier.

12. A lithographic apparatus comprising:
an alignment sensor;
a patterning device support configured to support a patterning device;
a substrate support configured to support a substrate;
a processing arrangement comprising a non-transitory computer program carrier comprising a computer program comprising program instructions operable to perform operations for modeling measurement data over a substrate area relating to a substrate in a lithographic process, the operations comprising:
obtaining measurement data relating to a first layout;
fitting a first model to the first layout, wherein the first model comprises an oblique subspace model or a generalized least squares model; and
performing a model mapping operation on the first model; and
a processor operable to run the computer program comprised on said non-transitory computer program carrier.

13. The lithographic apparatus of claim 12, wherein the alignment sensor is operable to measure the substrate to obtain the measurement data.

14. The lithographic apparatus of claim 12, wherein the processing arrangement is further operable to determine corrections configured to control the patterning device and/or substrate support based on the first model.

\* \* \* \* \*